United States Patent [19]

Amazawa

[11] Patent Number: 4,899,389
[45] Date of Patent: Feb. 6, 1990

[54] PULSATING NOISE REMOVAL DEVICE

[75] Inventor: Kiyoshi Amazawa, Tokyo, Japan

[73] Assignee: Clarion Co., Ltd., Tokyo, Japan

[21] Appl. No.: 156,362

[22] Filed: Feb. 16, 1988

[30] Foreign Application Priority Data

Feb. 17, 1987 [JP] Japan .................................. 62-34341
Feb. 17, 1987 [JP] Japan .................................. 62-34342

[51] Int. Cl.$^4$ .......................... H04B 1/10; H04B 1/64
[52] U.S. Cl. ...................................... 381/94; 455/297; 455/303
[58] Field of Search .................. 381/94; 455/296, 297, 455/303, 308, 212, 218, 221, 222, 225; 358/167, 36, 336, 905

[56] References Cited

U.S. PATENT DOCUMENTS

| 4,090,221 | 5/1978 | Connor | 358/167 |
| 4,434,438 | 2/1984 | Rzeszewski | 358/167 |
| 4,539,594 | 9/1984 | Illitschko | 358/36 |
| 4,587,620 | 5/1986 | Niimi | 455/296 |
| 4,648,129 | 3/1987 | Toffolo | 455/303 |

Primary Examiner—Tommy P. Chin
Attorney, Agent, or Firm—Flynn, Thiel, Boutell & Tanis

[57] ABSTRACT

A pulsating noise removal device includes first and second variable attenuators for varying signal levels of an audio signal component and a noise signal component both involved in an entered signal to use an output of the first variable attenuator to control the first and second variable attenuators and to use an output of the second attenuator to control a gate circuit for switching the entered signal, so that an inversion phenomenon is reliably prevented against a change either in the audio signal level or in the audio signal frequency.

9 Claims, 9 Drawing Sheets

PULSATING NOISE REMOVAL DEVICE

FIELD OF THE INVENTION

This invention relates to a pulsating noise removal device used in a car radio, etc.

BACKGROUND OF THE INVENTION

Most car radios are provided with a noise removal device for eliminating pulsating noises caused by an ignition plug of a car and entering in a radio transmission signal.

A noise removal device of this type is configured to detect pulsating noises in an audio signal by a noise detecting circuit and to switchingly remove the pulsating noises by a gate circuit.

FIG. 5 is a block diagram of a pulsating noise removal device used in most car radios.

In FIG. 5, a high-pass filter (HPF) 1 removes an audio signal S out of an input signal $v_i$ from a terminal 2 to extract a pulsating noise N alone. The pulsating noise N obtained from the filter 1 is amplified by an amplifier 3, and subsequently sent to an automatic gain control (AGC) circuit 4 and a monostable multivibrator circuit 5.

The monostable multivibrator circuit 5 produces a switching pulse in response to the pulsating noise N when the noise N is above a predetermined level, and shuts a gate circuit 6. In most cases, the gate circuit 6 is of a preholding type or of a signal compensation type. In this case, the gate circuit 6 is normally conductive to pass the input signal $v_i$ in the original form as an output signal $v_o$ through a terminal 7. When the switching pulse is applied from the monostable multivibrator circuit 5 to the gate circuit 6, the gate circut 6 is shut so as to not pass the input signal $v_i$, and removes the pulsating noise N involved in the input signal v.

The AGC circuit 4 controls the gain of the amplifier 3 to prevent continuous blockage of the gate circuit 6 and continuous interruption of the output signal.

FIG. 6 shows the waveform of the audio signal S from which the noise N is removed by the preholding type gate circuit.

In FIG. 6, S designates the audio signal (entered signal), and Tsw represents the switching time taken for removal of the pulsating noise N and having the time width corresponding to an estimated time width of a pulsating noise. T designates the period or interval of the pulsating noises which actually depends on noise sources. The switching is performed by the switching pulse from the monostable multivibrator circuit 5 of FIG. 5.

FIG. 7 shows the relationship between the audio signal frequency $f_s$ and the signal distortion Ds upon a switching. It is recognized that the distortion ratio increases with the signal frequency $f_s$. A similar tendency is admitted when the gate circuit 6 is of a linear compensation type.

FIG. 8 shows an inversion phenomenon upon removal of pulsating noises by a switching. In the switching time Tsw, the audio signal S takes the form of $P_1$-$P_2$-$P_3$ and loses a portion as much as an area As with respect to the original signal. When no noise removal is effected, a pulsating noise component An shown by hatched lines in FIG. 8 is added to the signal S. These components As and An both invite a distortion from the original signal. When component An is sufficiently large with respect to component As (when pulsating noise is large), the system is switched to effect its noise removal operation to reduce the signal distortion. Most noise removal devices are based on the foregoing configuration.

In contrast, when component An is small with respect to component As (when pulsating noise is small), switching the system rather invites an increase in the distortion, and invits a so-called "inversion phenomenon".

Therefore, noise removal operation must be withheld in this case.

However, since the area As of the signal lost by the switching changes with the signal frequency, that is, decreases with a decrease in the signal frequency and increases with an increase in same, it is preferable to perform noise removal operation at low signal frequencies and interrupt it at high frequencies causing an inversion phenomenon assuming that the magnitude of the pulsating noise is constant. However, prior art noise removal devices are not configured in this fashion.

OBJECT OF THE INVENTION

It is therefore an object of the invention to provide a pulsating noise removal device capable of preventing an inversion phenomenon.

SUMMARY OF THE INVENTION

In order to achieve the object, an inventive system comprises a noise detecting means for extracting noise signal components involved in an entered signal, an audio signal detecting means for extracting audio signal components involved in the entered signal, a gate means for switching the input signal, first and second level changing means for changing the signal levels of the extracted noise signal components and audio signal components, a level control means responsive to an output of the second level changing means to control the first and second level changing means, and a gate control means responsive to an output of the first level changing means to control the switching action of the gate means.

Alternatively, the inventive system comprises a noise detecting means for extracting noise signal components included in an entered signal, an absolute value converting means for differentiating audio signal components included in the entered signal and converting it to an absolute value, a changing means responsive to a signal from said absolute value converting means to change the noise signal components from the noise detecting means, and a gate means responsive to the changed noise signal components from the changing means to switch the entered signal.

DETAILED DESCRIPTION

Figure 1:
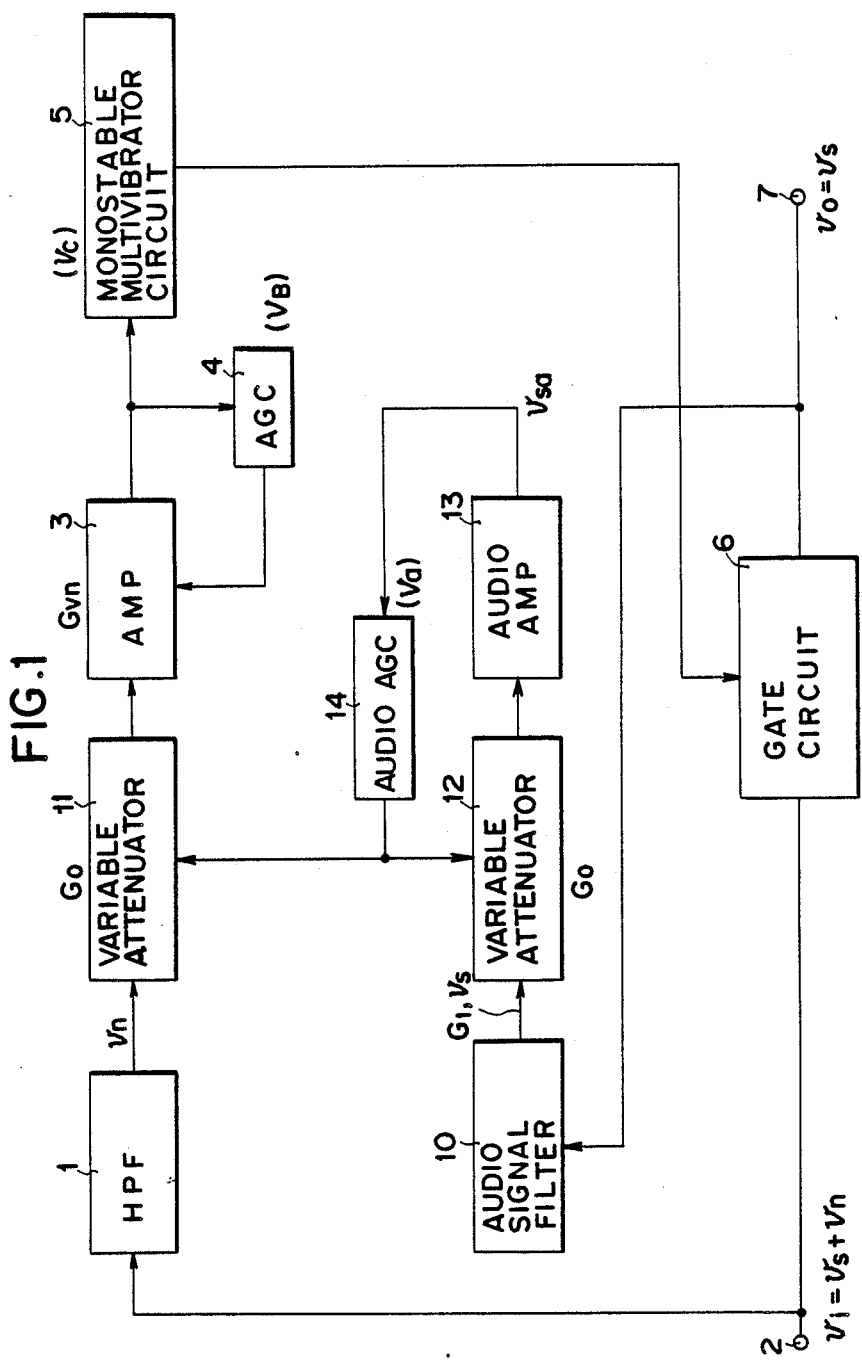
FIG. 1 is a block diagram of a pulsating noise removal device embodying the invention.

The invention is described below in detail, referring to some preferred embodiments illustrated in the drawings.

First of all, principles of the invention are explained below, referring to FIGS. 2 and 3.

Figure 2:
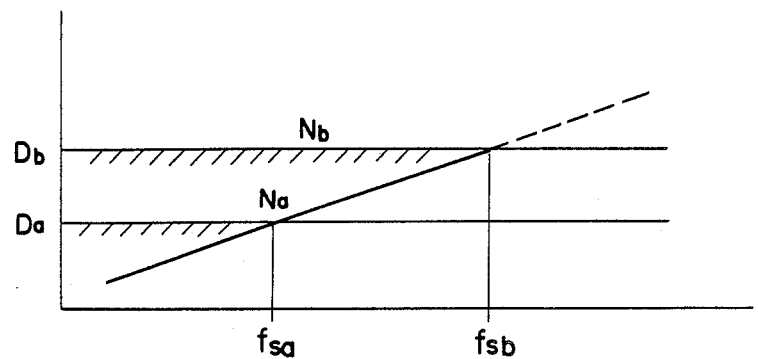
FIGS. 2 and 3 are explanatory views for presenting the principles of the invention.

FIG. 2 is a view for explaining an improvement of an inversion phenomenon against the signal frequency. When a constant noise Na causing a signal distortion Da is entered, noise removal operation is controlled, taking an audio signal frequency $f_{sa}$ causing an inversion phenomenon as a boundary. More specifically, in frequencies below $f_{sa}$, the system is activated to effect noise removal operation, whereas in frequencies above $f_{sa}$, the system does not effect noise removal operation. As a result, the signal distortion is about Da above frequency $f_{sa}$, and less than Da below frequency $f_{sa}$. Therefore, no inversion phenomenum occurs.

When the noise level increases from noise Na causing signal distortion Da to noise Nb causing signal distortion Db, the boundary frequency causing an inversion phenomenon is changed from $f_{sa}$ to $f_{sb}$, and the system is controlled, taking the latter frequency $f_{sb}$ as the boundary.

As a result, although the maximum signal distortion increases from Da to Db, the signal distortion is reliably limited to Db or less.

Such a noise removal operation may be effected by controlling the detection level of the noise detection circuit according to the signal frequency.

The human acoustic sense can distinguish a noise when the audio signal level is lower than the noise level. However, the same noise cannot be distinguished when the audio signal level is large. This is a masking effect.

Prior art pulsating noise removal merely depended on the noise level, regardless of the audio signal level. Small pulsating noises, even if not removed, do not cause a problem in presence of an audio signal above a level, but are a niusance to human ears when the audio signal level is small, e.g. in no signal condition.

The invention can compare the pulsating noise with the audio signal level to prevent an inversion phenomenon caused by changes in the audio signal level, in addition to an inversion phenomenum caused by changes in the audio signal frequency described above.

Figure 3:
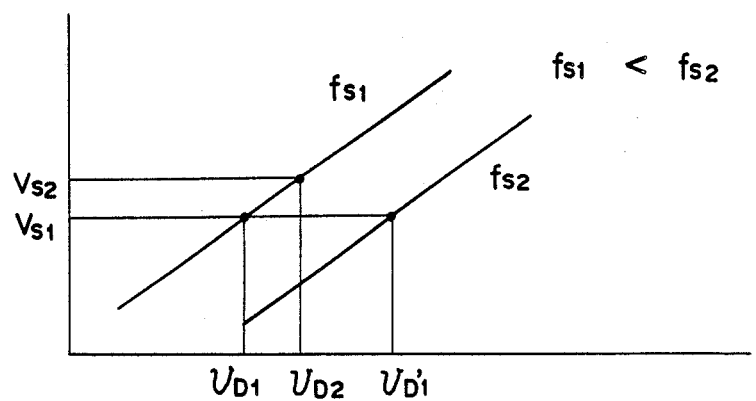

FIG. 3 shows such an operation. When an audio signal $v_{sl}$ having frequency $f_{sl}$ is entered in the gate circuit, the system selects $v_{Dl}$ as the level for detecting pulsating noises so as to not effect a switching against small pulsating noises causing an inversion phenomenon. When the audio signal input level increases to $v_{s2}$, the noise detection level is elevated to $v_{D2}$ so as to not effect a switching against pulsating noises including those larger than pulsating noises during the input level $v_{sl}$.

When the audio signal frequency is increased from $fs1$ to $fs2$, the detection level is elevated from $v_{D1}$ to $v_{D2}$ also when the input level if $v_{sl}$, so as to not detect small noises. As a result, an inversion phenomenon is prevented against a change either in the signal frequency or in the signal level.

FIG. 1 shows an arrangement of a pulsating noise removal device embodying the invention in which reference numeral 10 refers to an audio signal filter, 11 and 12 to variable attenuators, 13 to an audio amplifier, and 14 to an audio AGC circuit.

In FIG. 1, the input signal $v_i$ is expressed by:

$$v_i = v_s + v_n \quad (1)$$

where $V_s$: audio signal component, and $v_n$: pulsating noise component

A noise removal operation is performed, detecting the noise component $v_n$ satisfying the following expression (2):

$$K < \frac{v_n}{v_s} \quad (2)$$

$$\text{where } K = \frac{v_n(K)}{v_s(K)} \quad (3)$$

The foregoing K represents the ratio between the audio signal component $v_s(K)$ and the pulsating noise component $v_n(K)$.

The audio signal filter 10 is supplied with an output signal from the gate circuit 6 to change K with audio signal frequency $f_s$. The high-pass filter 1 is supplied with the entered signal $v_i$ from the gate circuit 6 to exclude audio signal component vs and extract noise component $v_n$ alone. Outputs from the filters 1 and 10 pass through the variable attenuators 11 and 12 which are controlled by signals passing through the variable attenuator 12, audio amplifier 13 and audio AGC circuit 14.

Representing by Go the voltage gain of the variable attenuators 11 and 12, Go=1 is valid when audio signal component $v_s = 1$, and Go approaches zero as $v_s$ increases.

The AGC circuit 4 is used to prevent a continuous blockage of the gate circuit 6 (interruption of the gate circuit output $v_o$) only when the pulsating noise period becomes very small, and is held inoperative otherwise.

Assuming that the loss of noise component vn by the filter 1 is zero, an output $v_{na}$ of the amplifier 3 is expressed by:

$$V_{na} = V_n \cdot Go \cdot Gvn \quad (4)$$

where

Go: voltage gains of variable attenuators 11 and 12, and

Gvn: gain of amplifier 3.

When the audio sigal component $v_s$ is entered, an output $v_{sa}$ of the audio amplifier 13 is expressed by:

$$V_{sa} = V_s \cdot Go \cdot G_l \cdot Gva = V_a \quad (5)$$

where $G_1$: voltage gain of audio signal filter 10,

Gva: gain of audio amplifier 13, and $v_a$: detection level of audio AGC circuit 14.

Therefore, the following equation is obtained:

$$G_0 = \frac{v_a}{v_s \cdot G_1 \cdot G_{va}} \quad (6)$$

From equations (4) and (6), the following equation is obtained:

$$v_{na} = \frac{v_n}{v_s} \cdot \frac{G_{vn}}{G_{va}} \cdot \frac{v_a}{G_1} \quad (7)$$

Assume here that the monostable multivibrator circuit 5 is activated when the output of the noise amplifier 3 reaches vc, and gives a predetermined switching pulse to the gate circuit 6 for its noise removal operation.

Selecting here K1 =

$$\frac{v_c}{v_a},$$

equation (7) may be expressed by:

$$v_{na} = \frac{v_n}{v_s} \cdot \frac{G_{vn}}{G_{va}} \cdot \frac{1}{G_1} \cdot \frac{v_c}{K_1} \quad (8)$$

Further assuming that an inversion phenomenum begins to occur when $v_n = v_n(K)$ and $v_s = v_s(K)$, $v_{na} = v_c$ must be satisfied, and the following equation is obtained from equations (3) and (8):

$$K = \frac{G_{va}}{G_{vn}} \cdot G_1 \cdot K_1 \quad (9)$$

In equation (9), if Gva, Gvn and K1 are fixed values whereas G1 varies with frequency, the value of K can be changed with frequency.

As referred to FIG. 3, an inversion phenomenon is not prevented unless increasing K and dropping the noise detection sensitivity as the audio frequency increases. Such an operation is performed by using the audio signal filter 10 as a high-pass filter.

Further, if the audio frequency is fixed, an appropriate noise removal operation is performed according to the noise level or the audio signal level.

Therefore, if the device shown in FIG. 1 is used to perform a noise removal operation satisfying equation (9), an inversion phenomenon is reliably prevented.

Although the embodiment of FIG. 1 was explained as being configured to take the entered signal from the gate circuit output to give it to the audio signal filter 10, it is not limited to this configuration. For example, the entered signal may be taken from the input of the gate circuit.

Figure 4:
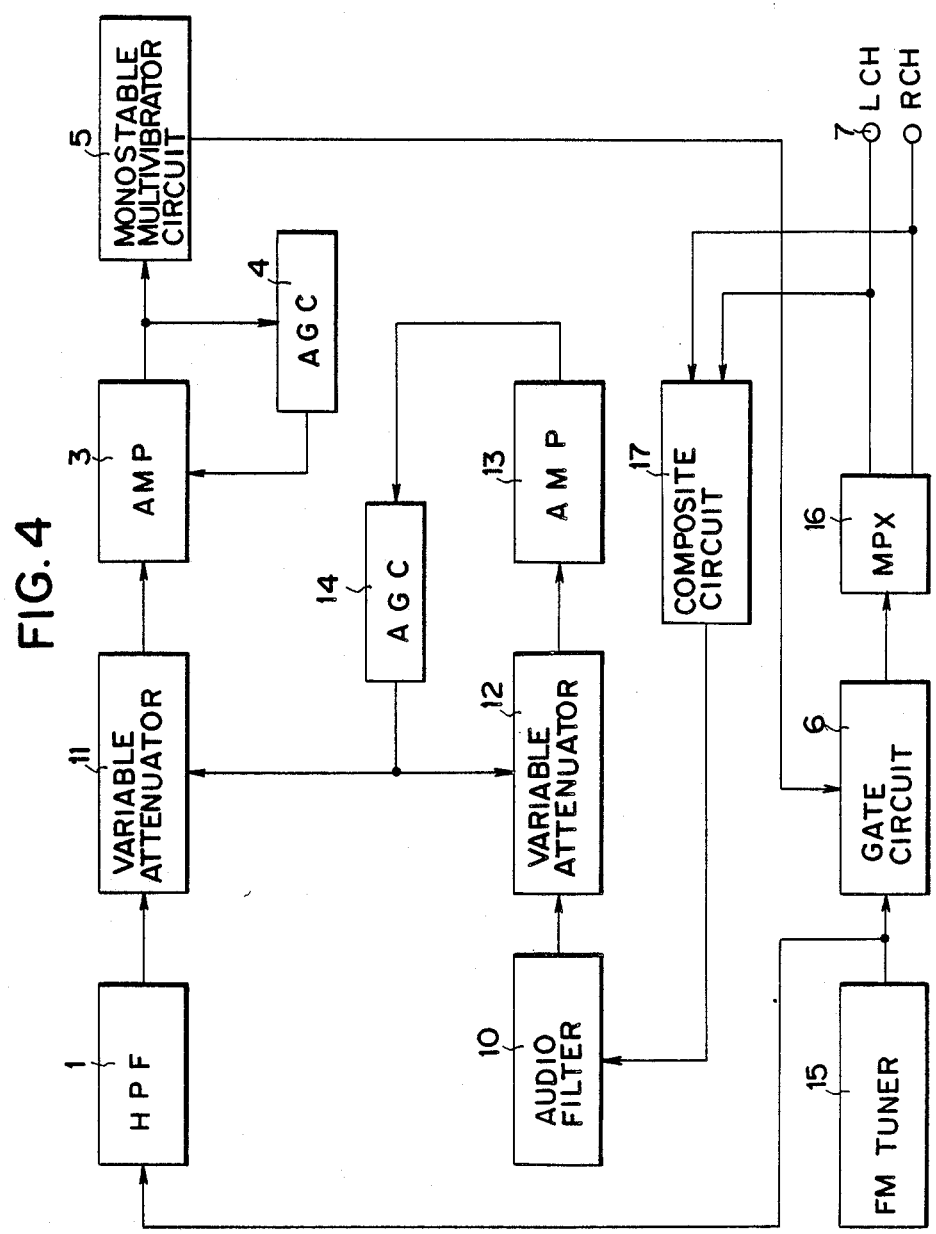
FIG. 4 is a block diagram of another pulsatig noise removal device embodying the invention.
Figure 5:
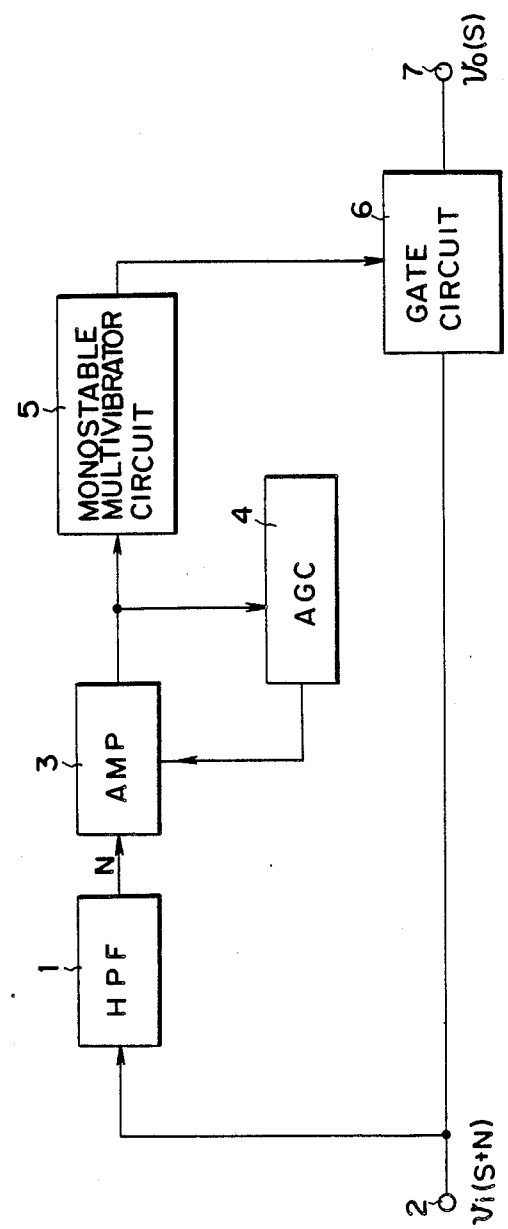
FIG. 5 is a block diagram of a prior art pulsating noise removal circuit.
Figure 6:
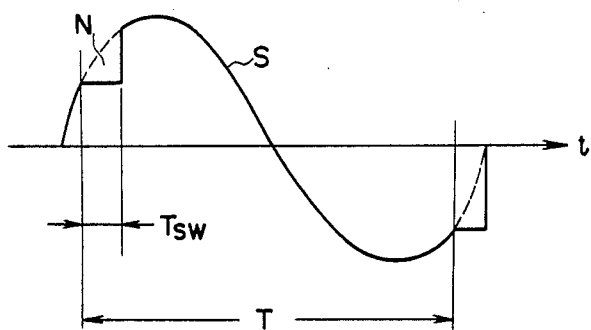
FIGS. 6 through 8 are views for explaining operations of the device of FIG. 5.
Figure 7:
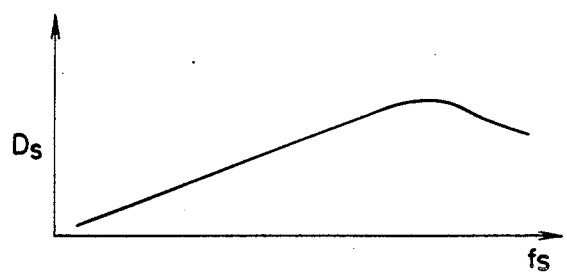

Further, the noise removal device of FIG. 1 was explained as removing noises from a composite signal in an FM receiver. However, as shown in FIG. 4, it is possible to give an audio signal for improvement of an inversion phenomenon, using a stereo demodulation signal of an FM multiplex. More specifically, the embodiment of FIG. 4 is configured to first enter an output of an FM tuner 15 in the gate circuit 6 and the filter 1, supply a composite circuit 17 via a multiplexer 16 with stereo signals LCH and RCH which are outputs from the gate circuit 6, conjoin the stereo signals LCH and RCH in the composite circuit 17 and enter a resulting signal in the audio signal filter 10.

Figure 9:
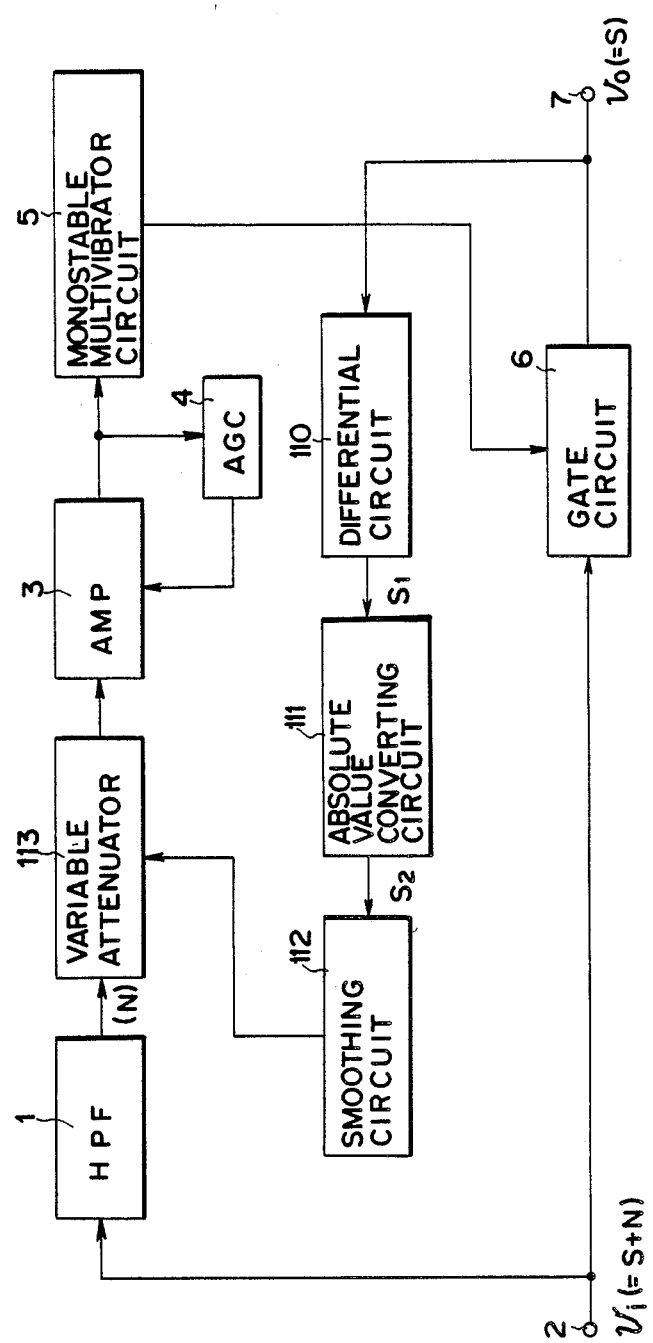
FIG. 9 is a block diagram of a still further pulsating noise removal device embodying the invention.

FIG. 9 shows a still further embodiment of the invention in which an optimum pulsating noise detecting condition not causing an inversion phenomenon is selected according to changes in the audio signal so as to reliably prevent an inversion phenomenon.

Figure 8:
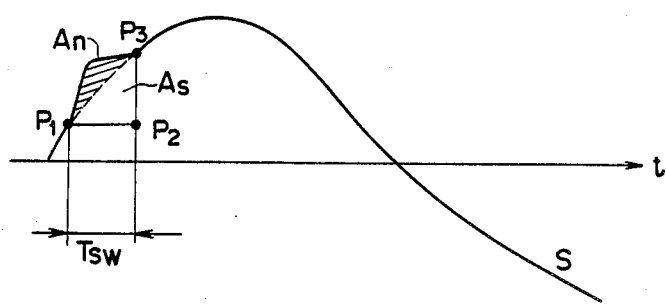

More specifically, since an inversion phenomenon is caused by the lost component As in the signal during a switching as shown in FIG. 8, the pulsating noise detection sensitivity is elevated; however the detection sensitivity being dropped when the component As is large so as to not remove small pulsating noises. In order to perform this operation, the component As may be estimated prior to a gate switching for noise removal to use the estimated signal to control the noise detection sensitivity.

Designating the signal by S, the area of the lost component As is expressed by:

$$As = K \cdot \frac{ds}{dt} \quad (10)$$

where K is the proportion constant.

In equation (10), the component As may take a negative value. Therefore, it may be changed to an absolute value thereof to use it to control the detection sensitivity.

In FIG. 9, reference numeral 110 refers to a differential circuit, 111 to an absolute value converting circuit, 112 to a smoothing circuit, and 113 to a variable attenuator.

The variable attenuator 113 is used to prevent an inversion phenomenum, and is activated in response to the condition of the audio signal to attenuate the level of the noise input to the amplifier 3.

As a result, the output signal $v_o$ of the gate circuit 6 consists of the audio signal S alone. The output signal $v_o$ ($=S$) is entered in the differential circuit 110 which differentiates the audio signal S to obtain the amplitude variation with time, i.e. a differential signal $S_1$. The signal $S_1$ has a proportional relationship with the component As shown in Equation (10), and may take either a positive value or a negative value according to the direction of the audio signal. Therefore, the signal $S_1$ is entered in the absolute value converting circuit 111 and changed to a predetermined direction to obtain an absolute value signal $S_2$. The output signal $S_2$ is entered in the smoothing circuit 112 having the following function. When the gate circuit 6 is off, the audio signal is not supplied from the gate circuit 6 actually. Therefore, the output $S_1$ does not exhibit a differential value of the audio signal S, and a distortion produced by a switching of the gate circuit 6 is differentiated. As a result, the differential signal is entered in the variable attenuator 113 and causes an unstable noise detecting operation. In this connection, the smoothing circuit 112 smoothes the absolute value coverting output signal to obtain a stable control signal $S_3$. As the differential signal $S_1$ increases, the smoothing circuit output $S^3$ increases so as to increase the attenuation amount of the variable attenuator 113 accordingly.

As a result, the noise detection sensitivity drops, and the system does not removes small pulsating noises so as to prevent an inversion phenomenum.

A detailed explanation is given below regarding how to make signals S1 through S3.

Figure 10:
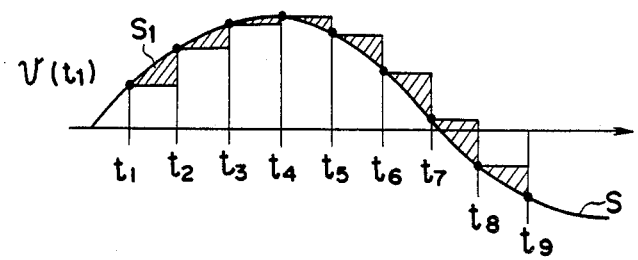
FIG. 10 shows the waveform of a differential signal of FIG. 9.

The differential signal S1 corresponds to an area of a portion shown by hatched lines in FIG. 10.

Where S is the entered signal to be differentiated, sampling signals S(t) of the entered signal S are designated by S(t1), S(t2) ..., S(tn), respectively, when sampled at constant interval times t1, t2, ..., tn, and differential signal S1 at these times are designated by S1 (t1) corresponding to a potion from t1 to t2, S1 (t2) corresponding to a portion from time t2 to t3 and S1 (tn) corresponding to a portion from time tn to tn+1, the following equations are obtained:

$$S1(t1) = S - S(t1) \ (t = t1 \sim t2)$$
$$S1(t2) = S - S(t2) \ (t = t2 \sim t3)$$
$$\vdots$$
$$S1(tn) = S - S(tn) \ (t = tn \sim tn + 1)$$
(11)

A specific arrangement of a differential circuit effecting such an operation is explained below, referring to FIG. 11.

Figure 11:
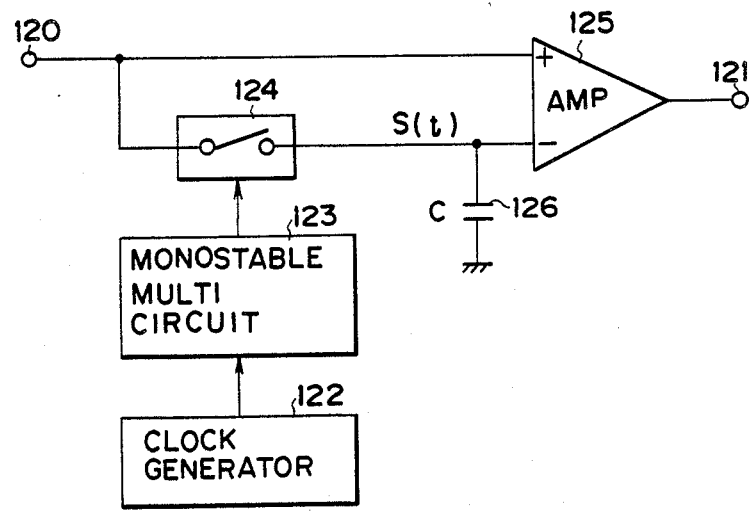
FIG. 11 is a block diagram of an absolute value converting circuit of FIG. 9.

In FIG. 11, reference numeral 120 refers to a signal input terminal, 121 to an output signal terminal, 122 to a clock generator, 123 to a monostable multivibrator circuit, 124 to a sampling switching, 125 to a differential amplifier, and 126 to a sampling holding capacitor.

The clock generator 122 produces a frequency sufficiently higher than the maximum frequency of the entered signal, and its pulse is appled to the monostable multivibrator circuit 123. The circuit 123 produces a pulse which turns on the sampling switch agains at time band sufficiently small with respect the period of the clock pulse. When the sampling switch is turned on, the sampling holding capacitor 126 is supplied with a level S(t) of the signal S to hold the level as long as the sampling switch takes the off position. The differential amplifer 125 obtains a difference between the signal S and the level S(t) of the sampling holding capacitor to produce a differential signal $S_1$.

Figure 12:
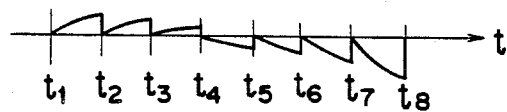
FIG. 12 shows the waveform of a differential signal of FIG. 11.

FIG. 12 shows the waveform of the differential signal obtained by the circuit of FIG. 11.

Figure 13:
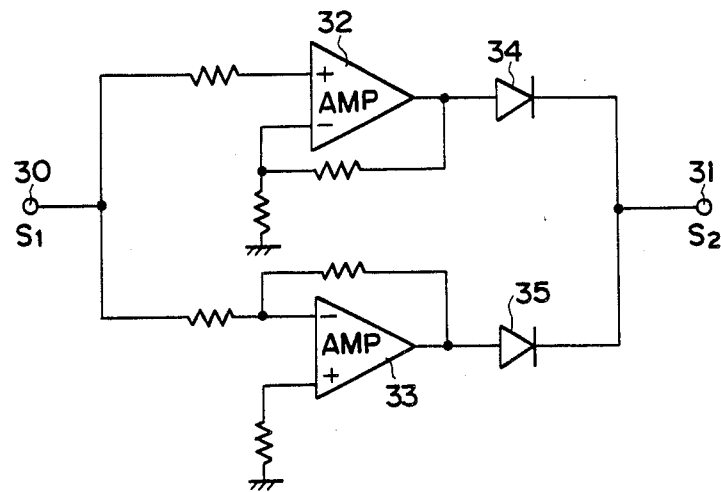
FIG. 13 is a block diagram of a differential circuit of FIG. 9.

The absolute value converting circuit is explained below, referring to FIG. 13 showing an arrangement thereof. In FIG. 13, reference numeral 30 refers to a differential signal input terminal, 31 to an absolute value converting output terminal, 32 to an in-phase amplifier, 33 to an anti-phase amplifier, and 34 and 35 to diodes.

The differential signal $S_1$ from the input terminal 30 is entered in the in-phase amplifier 32 and in the anti-phase amplifier 33. Outputs of the amplifiers 32 and 33 are entered in the diodes 34 and 35 from which +signals alone are extracted and conjoined. The composite signal serves as the absolute value converting signal output $S_2$. As a result, assuming that the waveform of the differential signal $S_1$ is as shown in FIG. 12, the absolute value converting output has the waveform shown in FIG. 14.

The smoothing circuit 112 is explained below.

The differential signal during the off-condition of the gate circuit 6 of FIG. 9 exhibits a value obtained by differentiating the signal distortion produced in the gate circuit 6 during a switching. When the absolute value of this differential signal is used to control the variable attenuator 113, a detected pulsating noise exhibits an unstable form. In this connection, the absolute value converting output signal $S_2$ may be smoothed in order to suppress the differential signal in this condition. Further, the smoothing operation changes the signal having large ripple components shown in FIG. 14 to a smooth signal which contributes to a smooth control of the variable attenuator 113 so that a stable noise signal is entered in the amplifier 3.

Figure 15:
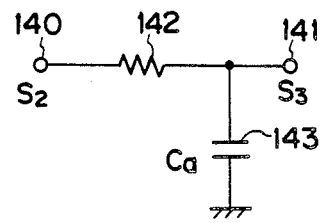
FIGS. 15 and 16 show different arrangements of a smoothing circuit of FIG. 9.

FIG. 15 shows an arrangement of the smoothing circuit in which referencce numeral 140 refers to an input terminal of the absolute value converting signal $S_2$, 141 to an output terminal of the smoothing output $S_3$, 142 to a resistor, and 143 to a capacitor.

In the circuit of FIG. 15, it is not expected to completely remove the differential signal of the signal distortion during the off-condition of the gate circuit 6.

Figure 14:
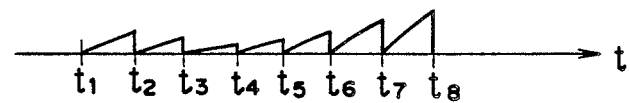
FIG. 14 shows the waveform of an output signal of FIG. 13.
Figure 16:
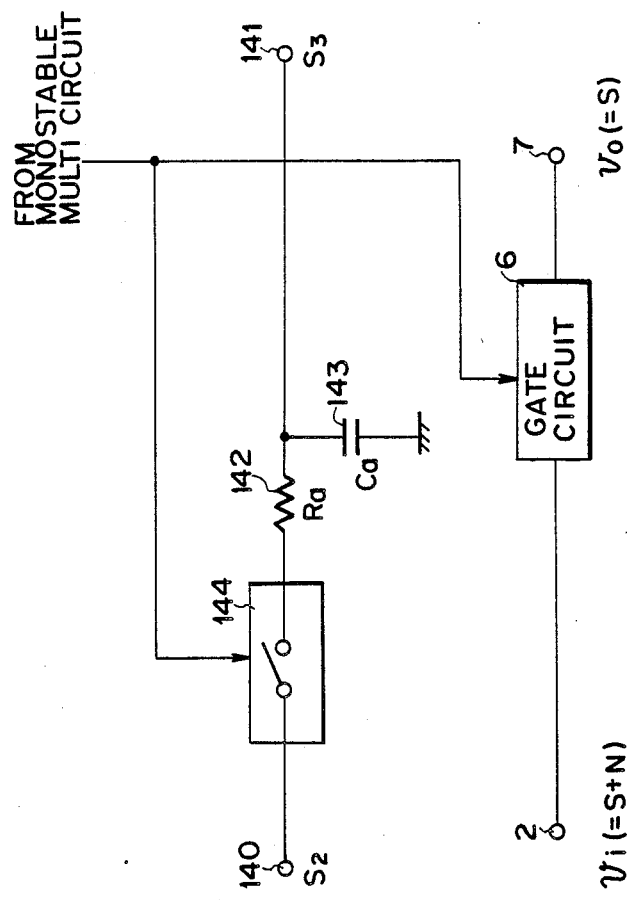

This problem is overcome by another arrangement of the smoothing circuit shown in FIG. 16 which includes a distortion removal switch 144 preceding the circuit of FIG. 15 consisting of the resistor 142 and capacitor 143. The switch 144 is controlled by a switching pulse from the monostable multivibrator circuit 5. In this fashion, while the gate circuit 6 is off and a signal distortion is produced, the differential signal is removed by the off-action of the distortion removal switch 144 to obtain a stable control signal $S_3$ of the variable attenuator 113. In the circuit of FIG. 14, the input of the differential circuit 110 of FIG. 9 may be taken either from the input of the gate circuit 6 or from the output thereof.

As explained above, by configuring the system to increase the attenuation amount of the variable attenuator and to attenuate the input level of the amplifier so as to drop the detection sensitivity upon an increase in the smoothing signal output $S_3$ obtained by passing the output of the gate circuit through the differencial circuit, absolute value converting circuit and smoothing circuit, an inversion phenomenum is reliably prevented against either a change in the audio signal level or a change in its frequency.

As described above, the invention gives the following effects:

(1) an inversion phenomenon is prevented against a change either in the level or in the frequency of the audio signal; and (2) since the pulsating noise detection sensitivity is controlled by the audio signal level, the system reliably prevents an erroneous switching operation upon a significant increase in the audio signal (erroneous noise removal operation caused by erroneously judging that the high level wave of the audio signal represents mixture of a pulsating noise).

What is claimed is:

1. A pulsating noise removal device comprising:
   noise detection means for extracting noise signal components in an entered signal;
   gate means for swithcing the entered signal;
   audio signal detection means for extracting audio signal components in the gated entered signal;
   first level changing means for varying the signal level of the extracted noise signal component;
   second level changing means for varying the signal level of the extracted audio signal component;
   level control means responsive to the audio signal component varied by said second level changing means to control said first and second level changing means; and
   gate control means responsive to the noise signal component varied by said first level changing means to control the switching action of said gate means.

2. A pulsating noise removal device according to claim 1 wherein said gate control means includes a noise amplifer means for amplifying the noise signal component varied by said first level changing means; a gain control means responsive to an output from said amplifier means to control the gain thereof; and a pulse generating means responsive to an output of said noise amplifier means to generate a pulse for controlling the switching action of said gate means.

3. A pulsating noise removal device comprising:
noise detection means for extracting noise signal components in an entered signal;
absolute value converting means for differentiating audio signal components in the entered signal and converting it to an absolute value;
changing means responsive to a signal from said absolute value converting means to vary the noise signal components from said noise detection means; and
gate means responsive to the noise signal components varied by said changing means to switch said entered signal.

4. A pulsating noise removal device according to claim 3 wherein said absolute value converting means includes a differential circuit for differentiating the audio signal compnent outputted from said gate means; an absolute value converting circuit for obtaining an absolute value of an output of said differential circuit; and a smoothing circuit for smoothing an output of said absolute value converting circuit.

5. A pulsating noise removal device according to claim 4 wherein said differential circuit includes a circuit for generating a clock pulse; a monostable multivibrator circuit supplied with said clock pulse; a sampling switch responsive to an output from said multivibrator circuit to sample the entered signal; and a differential amplifier for amplifying the difference between an output of said switch and said entered signal.

6. A pulsating noise removal device according to claim 4 wherein said absolute value converting circuit includes in-phase and anti-phase amplifiers for amplifying the in-phase and the anti-phase of the differential signal of said audio signal components, respectively; and first and second diodes for rectifying respective outputs of said amplifiers.

7. A pulsating noise removal device according to claim 4 wherein said smoothing circuit is a circuit including a resistor and a capacitor.

8. A pulsating noise removal device according to claim 7 wherein said smoothing circuit further includes a switch preceding said resistor and said capacitor and responsive to an output of said noise detection means to switch said absolute valve.

9. A pulsating noise removal device, comprising:
noise detection means for extracting noise components from an input signal which includes said noise components and an information component;
further detection means for detecting a characeristic of said information component of said input signal;
changing means for varying characteristic of said noise components extracted by said noise detection means in response to variation of said characteristic of said information component detected by said further detection means;
a gate having a signal input to which said input signal is applied, having a signal output and having a control input; said gate selectively effecting and interrupting transmission of said input signal from said signal input to said signal output thereof in response to a control signal applied to said control input; and
gate control means operatively coupled to said changing means and said control input of said gate and responsive to said noise components varied by said changing means for generating said control signal for said control input of said gate.

* * * * *

UNITED STATES PATENT AND TRADEMARK OFFICE
CERTIFICATE OF CORRECTION

PATENT NO. : 4,899,389

DATED : February 6, 1990

INVENTOR(S) : Kiyoshi AMAZAWA

It is certified that error appears in the above-identified patent and that said Letters Patent is hereby corrected as shown below:

Column 9, line 25; change "an" (second occurrence) to --said--.

Signed and Sealed this

Twenty-fourth Day of September, 1991

Attest:

HARRY F. MANBECK, JR.

Attesting Officer

Commissioner of Patents and Trademarks